United States Patent
Kang et al.

[11] Patent Number: 5,963,805
[45] Date of Patent: Oct. 5, 1999

[54] METHOD FOR FORMING INTEGRATED CIRCUIT CAPACITORS INCLUDING DUAL LAYER ELECTRODES

[75] Inventors: Man-sug Kang; Seung-joon Ahn, both of Kyungki-do, Rep. of Korea

[73] Assignee: Samsung Electronics Co., Ltd., Kyungki-do, Rep. of Korea

[21] Appl. No.: 08/884,149

[22] Filed: Jun. 27, 1997

[30] Foreign Application Priority Data

Jun. 28, 1996 [KR] Rep. of Korea ................ 96-25226

[51] Int. Cl.$^6$ ................................ H01L 21/8242
[52] U.S. Cl. ................................ 438/255; 438/398
[58] Field of Search ........................ 438/255, 398

[56] References Cited

U.S. PATENT DOCUMENTS

| | | | |
|---|---|---|---|
| 5,234,862 | 8/1993 | Aketagawa et al. | 437/103 |
| 5,366,917 | 11/1994 | Watanabe et al. | 437/47 |
| 5,372,962 | 12/1994 | Hirota et al. | 437/47 |
| 5,385,863 | 1/1995 | Tatsumi et al. | 437/109 |
| 5,394,012 | 2/1995 | Kimura | 257/739 |
| 5,405,801 | 4/1995 | Han et al. | 437/60 |
| 5,447,878 | 9/1995 | Park et al. | |
| 5,464,791 | 11/1995 | Hirota | 437/60 |
| 5,486,488 | 1/1996 | Kamiyama | 437/60 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozawa | 364/496 |
| 5,595,937 | 1/1997 | Mikagi | 437/192 |
| 5,597,754 | 1/1997 | Lou et al. | 438/255 |
| 5,616,511 | 4/1997 | Hirota | 438/396 |
| 5,623,243 | 4/1997 | Watanabe et al. | 257/309 |
| 5,639,689 | 6/1997 | Woo | 438/255 |

FOREIGN PATENT DOCUMENTS 4-286151 10/1992 Japan .

OTHER PUBLICATIONS

H. Watanabe et al., A New Cylindrical Capacitor Using Hemispherical Grained Si (HSG–Si) for 256Mb DRAMs, IEDM 92–259–262, 1992 IEEE, pp. 10.1.1–10.1.14 (No Month).

*Primary Examiner*—Jey Tsai
*Attorney, Agent, or Firm*—Myers Bigel Sibley & Sajovec

[57] ABSTRACT

A method for forming an integrated circuit capacitor includes the steps of forming a first electrode layer on a substrate wherein the first electrode has a first dopant concentration, and forming a second electrode layer on the first electrode layer opposite the substrate. The second electrode layer has a second dopant concentration different from the first dopant concentration. In addition, a portion of the second electrode layer is converted to a hemispherical grain layer. More particularly, the first dopant concentration is greater than the second dopant concentration. Related structures are also discussed.

33 Claims, 5 Drawing Sheets

METHOD FOR FORMING INTEGRATED CIRCUIT CAPACITORS INCLUDING DUAL LAYER ELECTRODES

FIELD OF THE INVENTION

The present invention relates to the field of integrated circuits and more particularly to methods for forming integrated circuit capacitors and related structures.

BACKGROUND OF THE INVENTION

In an integrated circuit memory device such as a dynamic random access memory (DRAM), a memory cell capacitor is used to store a bit of information. As the integration densities of these memory devices increase, however, the area of each memory cell capacitor may be reduced. The memory cell capacitance, however, should be maintained or increased to provide an adequate margin with respect to soft errors generated by α-rays and noise. To maintain the desired capacitance while decreasing the size of a memory cell capacitor, methods have been adopted using a ferroelectric layer having a relatively high dielectric constant or increasing an effective area of the capacitor electrode. In particular, the effective area of a capacitor electrode can be increased using a hemispherical grained electrode.

A method for forming a hemispherically grained electrode for a capacitor will now be discussed with reference to FIGS. 1 through 4. As shown in FIG. 1, a field oxide layer 12 is formed on a semiconductor substrate thus defining active and field areas of the semiconductor substrate 10. An interlayer insulating layer 14 is formed on the substrate 10 and the field oxide layer 12, and a first photoresist pattern 16 exposes a portion of the insulating layer 14 opposite an active area of the semiconductor substrate 10. The insulating layer 14 is then etched using the first photoresist pattern 16 as an etching mask to form a contact hole 18 exposing a portion of an active area of the substrate.

The first photoresist pattern 16 is then removed, and a conductive layer 20 is formed on the insulating layer 14 filling the contact hole 18 as shown in FIG. 2. In particular, the conductive layer 20 is formed from a layer of doped silicon, and the conductive layer 20 is in electrical contact with the substrate 10. The conductivity of the conductive layer 20 is determined by the dopant concentration thereof. The dopant concentration of the conductive layer 20, however, also influences the size of the hemispherical grains of silicon which will be formed thereon. Generally, the size of hemispherical grains increases as the dopant concentration decreases. If the dopant concentration of a capacitor electrode is too low, a minimum ($C_{min}$)-to-maximum ($C_{max}$) ratio (C') of the capacitance of the resulting capacitor may be decreased. The resistance of the capacitor to soft errors may be reduced with a low C' value thus increasing the likelihood that stored data may be lost. Accordingly, there is a lower limit to the dopant concentration allowable for the lower electrode.

In addition, the portion of the conductive layer 20 in the contact hole 18 provides an electrical path from the capacitor electrode to the substrate. If the resistance of this conductive path is increased by lowering the dopant concentration of the conductive layer 20, however, the operational speed of the capacitor may decrease and the overall operation of the memory device may be slowed. Accordingly, the conductive layer 20 is typically doped to a concentration in the range of $10^{19}$ to $10^{21}$ atoms per cm$^3$. A C' value of about 0.9 can be obtained for a capacitor including the electrode discussed above having a dopant concentration in the range of $10^{19}$ to $10^{21}$ atoms per cm$^3$.

A second photoresist pattern 22 is formed on the conductive layer 20 as shown in FIG. 2. This second photoresist pattern 22 is used as a mask when patterning the conductive layer 20. In particular, the conductive layer 20 is etched using the second photoresist pattern 22 as an etching mask to form a lower electrode 20a for a capacitor as shown in FIG. 3. The second photoresist pattern 22 is then removed.

Grain seedlings are formed on the lower electrode 20a by injecting silane ($SiH_4$) or disilane ($Si_2H_6$) gas into a reaction chamber. The gas supply used to form the grain seedlings is then interrupted, and the lower electrode 20a with the grain seedlings is annealed at a predetermined temperature. Hemispherical silicon grains are formed centered around the grain seedlings thus forming an HSG layer 26 on the surface of the lower electrode 20a, as shown in FIG. 4. A capacitor using hemispherical grained-Si is discussed, for example, in the reference by Watanabe et al. entitled "A New Cylindrical Capacitor Using Hemispherical Grained Si (HSG-Si) for 256 Mb DRAMS," IEDM 92-259, 1992 IEEE, pp. 10.1.1 to 10.1.4. A dielectric layer is then formed on the HSG layer 26, and a conductive layer is formed on the dielectric layer to provide the second capacitor electrode.

As discussed above, the dopant concentration of the lower electrode should be increased to $10^{19}$ to $10^{21}$ atoms per cm$^3$ to provide a desired C' value. Because the size and reproducibility of the hemispherical silicon grains are inversely proportional to the dopant concentration of the lower electrode, the size of the hemispherical silicon grains increases as the dopant concentration decreases. Conventional capacitor electrodes fabricated to provide a predetermined C' value, however, may have sufficiently high dopant concentrations that the reproducibility and size of the hemispherical silicon grains are less than desired. The reduced reproducibility may result in a difference in electrode surface areas between capacitors so that the capacitance of different capacitors vary. Accordingly, conventional methods for forming hemispherical silicon grains may be unable to provide a desired reliability when device integration is increased.

SUMMARY OF THE INVENTION

It is therefore an object of the present invention to provide improved methods for forming electrodes and related structures.

It is another object of the present invention to provide methods for forming capacitor electrodes having increase surface areas and related structures.

It is still another object of the present invention to provide methods for forming capacitor electrodes which provide an increased C' value and related structures.

These and other objects are provided according to the present invention by methods including the steps of forming a first electrode on a substrate wherein a first electrode layer has a first dopant concentration, and forming a second electrode layer on the first electrode layer opposite the substrate wherein the second electrode layer has a dopant concentration different from the first dopant concentration. A portion of the second electrode layer is then converted to a hemispherical grain layer. In particular, the first dopant concentration can be greater than the second dopant concentration. Accordingly, the first electrode layer with a greater dopant concentration provides a desired conductivity for the electrode while the second electrode layer with the lower dopant concentration allows the growth of larger hemispherical grains. These larger hemispherical grains can provide an increased surface area for the electrode thus formed. The electrode layers and the hemispherical grain layer thus provide a lower electrode for a capacitor, and a dielectric layer can be formed on the hemispherical grain layer and a conductive layer can be formed on the dielectric layer to provide a second electrode for the capacitor.

The step of forming the first electrode layer can be preceded by the step of forming an insulating layer on the substrate. In particular, the insulating layer can have a contact hole therein exposing the semiconductor substrate wherein the first electrode layer fills the contact hole making electrical contact with the semiconductor substrate. Accordingly, the first electrode layer, the second electrode layer, and the hemispherical grain layer can provide the lower electrode of a capacitor for a memory cell. In addition, the converting step can be followed by the step of increasing a dopant concentration of the hemispherical grain layer. The dopant concentration can be increased by thermal diffusion or by ion implantation, and the increased dopant concentration can increase the C' value for the capacitor including the lower electrode thus formed.

The converting step can include the steps of forming grain seedlings on the second electrode layer and annealing the grain seedlings on the second electrode layer. The annealing step causes the grain seedlings to grow into hemispherical silicon grains. These hemispherical grains thus increase the surface area of the lower electrode.

The method can also include the step of forming a spacer along sidewalls of the first electrode layer. This spacer has a third dopant concentration which is different from the first dopant concentration, and the converting step includes converting a portion of the spacer to the hemispherical grain layer. More particularly, the first dopant concentration is greater than the second and third dopant concentrations. Accordingly, the surface area of the lower electrode can be further increased because the larger hemispherical grains are formed along sidewalls of the first electrode layer.

The converting step can also be followed by the step of increasing a dopant concentration of the hemispherical grain layer. The dopant concentration can be increased by thermal diffusion or by implanting dopant ions into the hemispherical grain layer. Furthermore, these ions can be implanted at an angle with respect to the surface of the substrate of less than 90°. Accordingly, portions of the hemispherical grain layer on sidewalls of the first electrode layer can also receive implanted ions.

According to an alternate aspect of the present invention, an integrated circuit capacitor can include a substrate, and an electrode layer on the substrate wherein the electrode layer has a surface opposite the substrate and sidewalls. A first hemispherical grain layer is on the surface of the electrode layer having the first grain size, and a second hemispherical grain layer is on the sidewalls of the electrode layer having the second grain size different from the first grain size. In particular, the first grain size can be greater than the second grain size so that the grains on the surface of the electrode layer opposite the substrate are larger than the grains on the sidewalls. Accordingly, a surface area of the lower electrode of a capacitor can be increased.

According to the methods and structures of the present invention, a lower electrode with a hemispherical grain layer thereon can be used to increase the capacitance of a capacitor while also increasing a C' value for the capacitor. More particularly, the hemispherical grain layer can be used to increase a surface area of a lower electrode.

DETAILED DESCRIPTION

Figure 1:
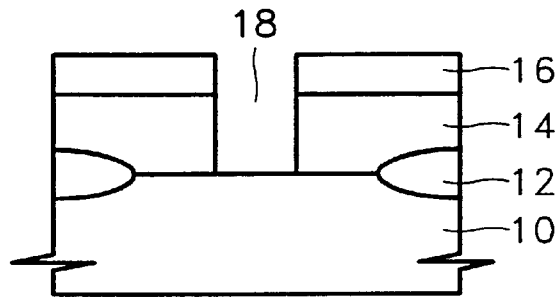
FIGS. 1 through 4 are cross-sectional views illustrating steps of a method for forming a capacitor electrode for an integrated circuit device according to the prior art.
Figure 2:
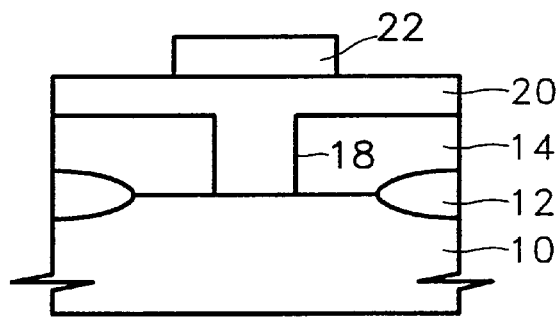
Figure 3:
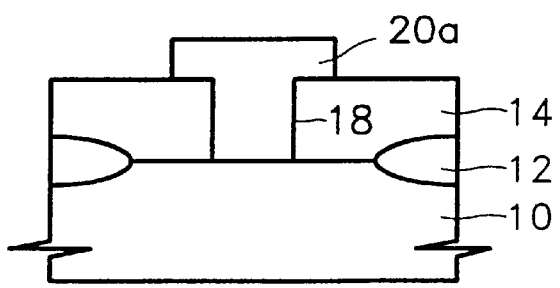
Figure 4:
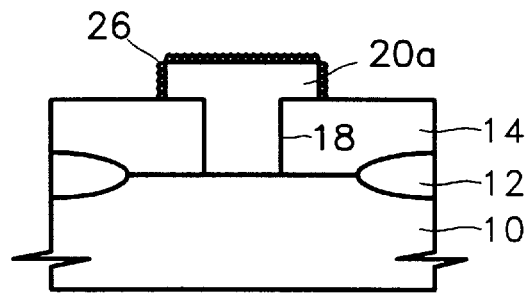

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 5:
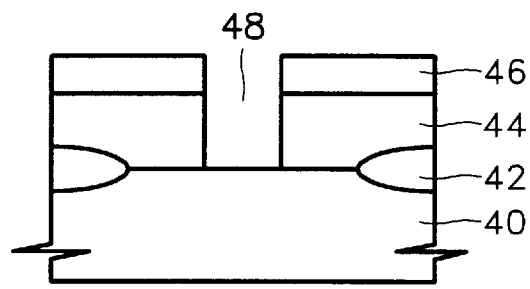
FIGS. 5 through 8 are cross-sectional views illustrating steps of a method for forming a capacitor electrode for an integrated circuit device according to the present invention.

A method for forming a capacitor for an integrated circuit device according to the present invention will be discussed below with reference to FIGS. 5 through 8. A field oxide layer 42 is formed on the semiconductor substrate 40 to define active and field areas of the substrate 40. An interlayer insulating layer 44 is formed on the semiconductor substrate 40 and the field oxide layer 42. A first photoresist pattern 46 exposes a portion of the insulating layer 44 opposite an active area of the substrate. The insulating layer 44 is then etched using the first photoresist pattern 16 as an etching mask to form the contact hole 48 as shown in FIG. 5. In particular, the contact hole 48 exposes a portion of an active area of the substrate.

Figure 6:
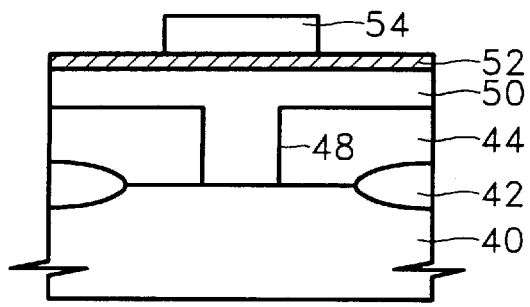

After removing the first photoresist pattern 46, a first electrode layer 50 is formed on the insulating layer 44 filling the contact hole 48. A second electrode layer 52 is formed on the first electrode layer 50. The second electrode layer may have a thickness less than that of the first electrode layer, and the second electrode layer can be formed in-situ. Accordingly, the first electrode layer 50 is in contact with an active area of the substrate 40 and the second electrode layer is on the first electrode layer opposite the insulating layer 44, as shown in FIG. 6. A second photoresist pattern 54 is formed on the second electrode layer 52.

The first and second electrode layers 50 and 52 can be formed from in-situ doped silicon layers each having a predetermined thickness. The first electrode layer 50 preferably has a thickness in the range of 3,000 to 10,000 angstroms, and is most preferably 6,000 angstroms. The second electrode layer preferably has a thickness in the range of 10 to 1,000 angstroms, and is most preferably approximately 1,000 angstroms. The first and second electrode layers 50 and 52 are preferably in-situ doped silicon layers doped with elements chosen from Groups III or V of the periodic table. The first and second electrode layers can be doped, for example, with phosphorous (P), arsenic (As), or boron (B). In addition, the dopant concentration of the second electrode layer 52 is preferably lower than that of the first electrode layer to provide hemispherical silicon grains of an adequate size while maintaining an adequately conductive path to the substrate. In particular, the first conductive layer 50 can have a dopant concentration in the range of $10^{19}$ to $10^{21}$ atoms per $cm^3$ and the second electrode layer 52 can have a dopant concentration of less than approximately $10^{19}$ atoms per $cm^3$.

The first electrode layer 50 can be formed using a source gas including silane ($SiH_4$), disilane ($Si_2H_6$), or a combination thereof. The second electrode 52 can be formed using the above mentioned source gases although not necessarily the same source gas as that used to form the first electrode layer. In the example discussed herein, the same source gas is used to form both the first and the second electrode layers. In particular, the first and second electrode layers 50 and 52 are formed in-situ at a temperature in the range of 470–530° C. and at a pressure in the range of 0.3 to 1.2 Torr.

Figure 7:
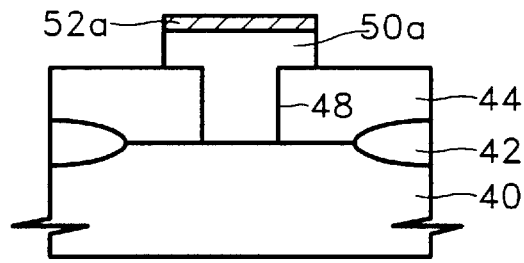

The second photoresist pattern 54 is used to pattern the first and second electrode layers 50 and 52 thus forming a lower electrode for a capacitor. The first and second electrode layers 52 and 50 are anisotropically etched using the second photoresist pattern as a mask. The second photoresist pattern 54 is thus transferred to the first and second electrode layers to form a lower capacitor electrode including the layers 50a and 52a. The second photoresist pattern 54 is then removed after the anisotropic etch as shown in FIG. 7. As will be discussed in greater detail below, the first patterned electrode layer 50a provides a lower electrode for a capacitor, and the second patterned electrode layer 52a is converted to a hemispherical grained (HSG) layer.

Figure 8:
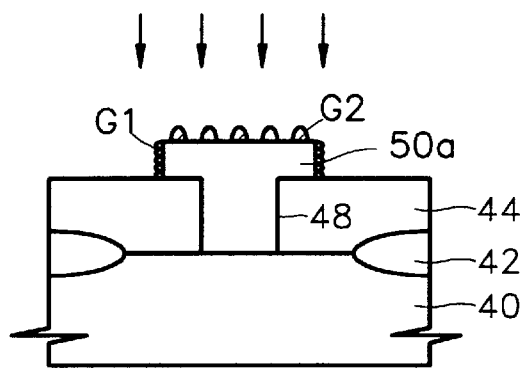

First and second HSG layers G1 and G2 are then formed as shown in FIG. 8. Grain seedlings are first formed on the surface of the second patterned electrode layer 52a and on exposed sidewalls of the first patterned electrode layer 50a. Hemispherical silicon grains are then formed around these grain seedlings as discussed below.

In particular, the hemispherical silicon grains are formed by placing the substrate 40 with the first and second patterned electrode layers 50a and 52a in a hot well type reaction chamber in a vacuum state. A predetermined amount of silane or disilane gas is then flowed at a predetermined temperature for a predetermined period of time. For example, the hemispherical silicon grains can be formed by flowing approximately 18 sccm of silane or disilane at approximately 610° C. for approximately 185 seconds. Grain seedlings are thus formed on exposed portions of the first and second patterned electrode layers 50a and 52a.

The grain seedlings are grown into hemispherical silicon grains by annealing the grain seedlings in-situ at a predetermined temperature for a predetermined period of time. For example, the grain seedlings can be annealed at approximately 600° C. for approximately 420 seconds. Accordingly, peripheral silicon atoms become concentrated around the grain seedlings to form the hemispherical silicon grains.

As previously discussed, the size of the hemispherical silicon grains may vary according to the dopant concentration of the material on which the hemispherical silicon grains are grown. In particular, hemispherical silicon grains formed on a heavily doped layer may be smaller than those formed on a lightly doped material. A first hemispherical silicon grain formed on the sidewall of the first patterned electrode layer 50a may thus be smaller than a second hemispherical silicon grained formed on the surface of the second patterned electrode layer 52a.

As the grains grow, the second patterned electrode layer 52a may be converted into hemispherical silicon grains. Accordingly, the first and second HSG layers Gi and G2 are formed of a plurality of respective first and second hemispherical silicon grains on the sidewalls of the first patterned electrode layer, and on the surface of the first patterned electrode layer opposite the insulating layer 44. Moreover, the hemispherical silicon grains of layer G2 may be larger than the grains of the layer G1.

The first HSG layer G1 on the sidewalls of the first patterned electrode layer 50a is thus made up of individual grains. The second HSG layer G2, however, is made up of grains that are larger than those of the first HSG layer G1. Because the second HSG layer G2 is made up of grains having a larger surface area, the surface area of the lower electrode can be increased. A capacitance for the capacitor can thus be increased using the method of the present invention. The lower dopant concentration of the second HSG layer G2, however, may result in a reduction of the minimum-to-maximum capacitance ratio (C'). The capacitance ratio C', however, can be increased as discussed below thus increasing resistance to soft errors and reducing the possibility of data loss when using such capacitor in a memory cell.

In particular, the dopant concentration of the second HSG layer G2 can be increased using a thermal process or an ion implantation to thus increase the C' value. The dopant concentration of the second HSG layer G2 can be increased using a thermal process wherein the second HSG layer G2 is heated to a temperature in the range of 750–950° C. in a nitrogen ($N_2$) atmosphere. Accordingly, dopant material from the first electrode layer is diffused into the second HSG layer G2 thereby increasing the dopant concentration of the second HSG layer G2 to a concentration of greater than approximately $10^{19}$ atoms per $cm^3$. Accordingly, the C' value of the capacitor can be increased to 0.9 or greater, thereby enhancing resistance of resulting capacitors to soft errors during operation of a memory device including the capacitor.

Alternately, the dopant concentration of the second HSG layer G2 can be increased by ion implantation. In particular, the second HSG layer can be implanted with ions such as phosphorous (P), arsenic (As), and boron (B). The second HSG layer G2 has a thickness which is approximately the same as the thickness of the second electrode layer 52. Accordingly, the second HSG layer G2 may have a thickness in the range of 10 to 1,000 angstroms, and the implantation energy can be controlled to distribute the implanted ions within a predetermined depth, for example, in the range of 1,000 angstroms from the surface of the second HSG layer G2. Using ion implantation, the dopant concentration of the second HSG layer G2 can be increased to greater than $10^{19}$ atoms per $cm^3$.

Accordingly, the C' value for the capacitor using the above described lower electrode can be increased to approximately 1 using either the thermal process or the implantation process. Accordingly, the resistance of the memory device to soft errors can be increased. In other words, the capacitance of the capacitor can be increased by a thermal step or an implant step after forming the first and second HSG layers G1 and G2. Because the C' value is close to 1, the resistance to memory errors can be increased thereby increasing the reliability of a memory cell including the capacitor with the above described lower electrode. Because the second HSG layer is formed on a layer having a relatively low dopant concentration, relatively large hemispherical silicon grains can be formed with a high degree of reproducibility.

A dielectric layer can be formed on the first and second HSG layers G1 and G2, and a conductive layer can be formed on the dielectric layer opposite the HSG layers to provide a second capacitor electrode. The use of the hemispherical silicon grains increases the surface area of the lower electrode thus increasing the capacitance for the resulting capacitor.

Figure 9:
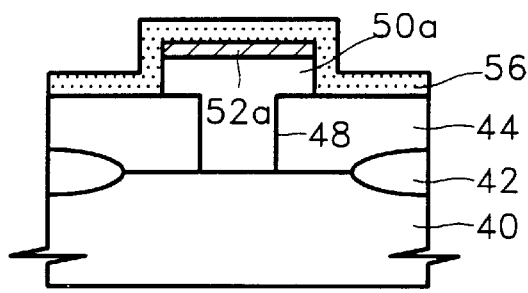
FIGS. 9 through 11 are cross-sectional views illustrating alternate steps for forming a capacitor electrode for an integrated circuit device according to the present invention.

Alternately, a lower electrode according to the present invention can be formed as discussed below with the reference to FIGS. 9 through 11. In particular, a third electrode layer with a relatively low dopant concentration is formed at the sidewalls of the first and second electrode layers 50a and 50b of FIG. 7. As shown in FIG. 9, first and second electrode layers are formed and patterned as discussed above with reference to FIGS. 5 through 7. A third electrode layer 56 is then formed on the first and second patterned electrode layers and the insulating layer 44 as shown in FIG. 9.

The third electrode layer 56 can be a layer of silicon with a thickness in the range of 10 to 1,000 angstroms formed using an in-situ method. The third electrode layer 56 can be doped with a dopant such as phosphorous (P), arsenic (As), and boron (B). The third electrode layer 56 can have a dopant concentration of less than approximately $10^{19}$ atoms per cm$^3$, and the third electrode layer can be formed using a source gas such as silane or disilane, or a mixture thereof.

The third electrode layer 56 is used to provide hemispherical silicon grains with increased size along the sidewalls of the first electrode layer 50a. Accordingly, the surface area of the lower electrode can be further increased thus allowing an increase in the capacitance of a capacitor using the lower electrode of the present invention.

Figure 10:
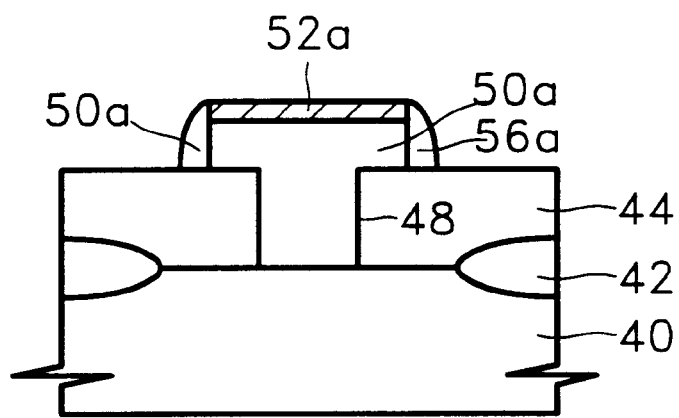

As shown in FIG. 10, the third electrode layer is patterned to provide spacers along the sidewalls of the first and second patterned electrode layers 50a and 52a. In particular, the third electrode layer 56 can be anisotropically etched to remove portions thereof from the insulating layer 44 and the surface of the second electrode layer 52a. A spacer 56a is thus formed along the sidewalls of the first and second patterned electrode layers 50a and 52a. Because the spacer 56a has a relatively low dopant concentration, the size of the hemispherical silicon grains along the sidewalls of the first patterned electrode layer 50a can be increased.

Figure 11:
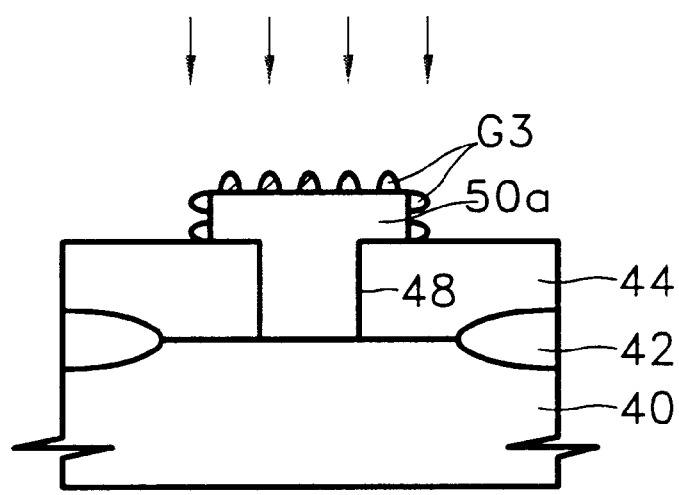

As shown in FIG. 11, a third HSG layer G3 is thus formed on the surface of the first electrode layer 50a opposite the insulating layer 44 and the sidewalls of the first patterned electrode layer 50a. In particular, the HSG layer G3 can be formed by loading the substrate in a hot well type reaction chamber where grain seedlings are formed on the surface of the second patterned electrode layer 52a and the spacer 56a. Thereafter, the grain seedlings are annealed in-situ to grow hemispherical silicon grains from the grain seedlings.

The grain seedlings can be formed by flowing a predetermined amount of silane or disilane into the hot well type reaction chamber at a predetermined temperature for a predetermined period of time. For example, 18 sccm of disilane (Si$_2$H$_4$) can be flowed into the hot well type reaction chamber at approximately 600° C. for approximately 185 seconds.

The grain seedlings can be annealed at a predetermined temperature for a predetermined period of time which is longer than that used to form the grain seedlings. For example, the grain seedlings can be annealed at approximately 600° C. for approximately 420 seconds using an in-situ annealing technique as described above with reference to FIGS. 7 and 8. The grain seedlings thus grow to form the third HSG layer G3. The third HSG layer is thus formed from the second patterned electrode layer 52a and the spacer 56a. As previously discussed, the second patterned electrode layer 52a and the spacer 56a are doped at a dose of approximately $10^{19}$ atoms per cm$^3$ which may be less than the dopant concentration of the first patterned electrode layer 50a. The more lightly doped layers may thus produce larger hemispherical silicon grains. The third HSG layer can thus be larger than an HSG layer which is formed from a more highly doped first patterned electrode layer 50a.

Accordingly, the surface area of the lower capacitor electrode can be further increased thereby increasing the capacitance of a capacitor including the lower electrode.

As before, the C' value can be increased by increasing the dopant concentration of the hemispherical silicon grains. That is, the low dopant concentration of the second patterned electrode layer 52a and the spacer 56a allows the formation of larger hemispherical silicon grains, but the resulting hemispherical silicon grains may have a lower dopant concentration resulting in a lower C' value. A thermal treatment or ion implantation can be used to increase the dopant concentration of HSG layer G3 thus increasing the C' value.

When using a thermal treatment, dopant material is diffused from the more highly doped first patterned electrode layer 50a to the more lightly doped third HSG layer G3. Accordingly, the dopant concentration of the third HSG layer G3 can be increased to greater than $10^{19}$ atoms per cm$^3$, thereby increasing the C' value for a capacitor including the lower electrode of FIG. 11.

Alternately, the dopant concentration of the third HSG layer G3 can be increased by ion implantation. In particular, the implant energy can be controlled to distribute the ions within a predetermined depth equal to the thickness of the second patterned electrode layer 52a. For example, the ions can be implanted within a depth of 1,000 angstroms from the surface of the third HSG layer G3 by controlling the implant energy. Accordingly, implanted ions can be primarily distributed within the third HSG layer G3 thereby increasing the dopant concentration of the third HSG layer G3.

A conventional ion implant step may effectively increase the dopant concentration of the portion of the third HSG layer G3 formed on the surface of the first patterned electrode layer 50a opposite the insulating layer 44. The dopant concentration of the third HSG layer G3 along the sidewalls of the first patterned electrode layer 50a, however, may not be sufficiently increased using a conventional ion implant step. Accordingly, the substrate 40 can be slanted or the ions can be implanted at an angle with respect to the substrate to increase the dopant concentration of portions of the third HSG layer G3 along the sidewalls of the first patterned electrode layer 50a.

Because the third HSG layer G3 has grains of increased size along the surface and sidewalls of the first patterned electrode layer 50a, the surface area of the lower electrode can be increased when compared to that of FIG. 8 wherein the grain size is increased primarily along the surface of the first electrode layer opposite the insulating layer 44. Accordingly, the lower electrode of FIG. 11 can be used to form a capacitor having increased capacitance when compared to electrodes of the prior art as well as the electrode of FIG. 8.

Figure 12A:
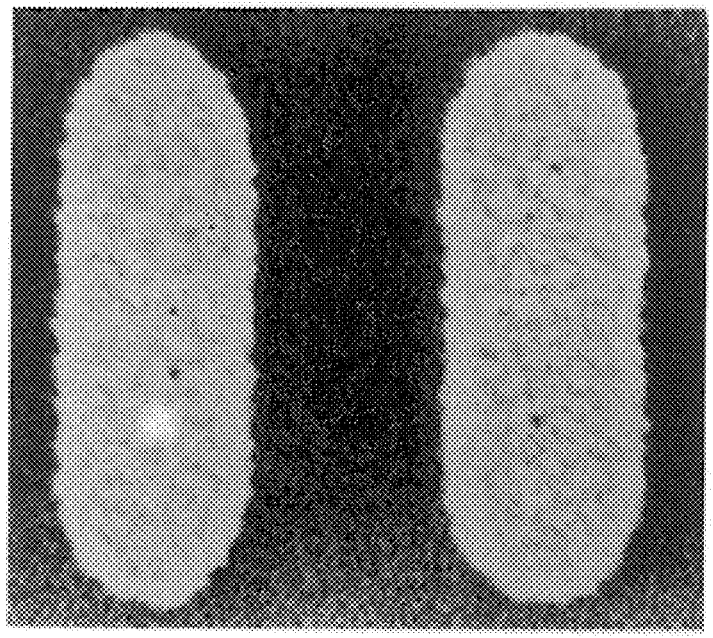
FIGS. 12a and 12b are photographs illustrating hemispherical grained (HSG) electrodes according to the present invention.
Figure 12B:
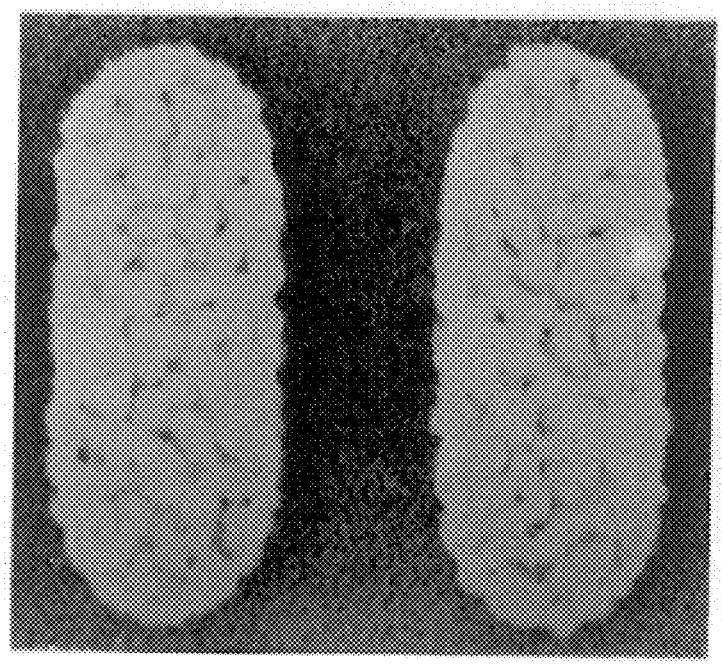

The variation in sizes of hemispherical silicon grains as a function of dopant concentration of the second electrode layer 52 will now be discussed with reference to FIGS. 12a and 12b. FIGS. 12a and 12b are photographs taken using a scanning electron microscope (SEM) at a magnification of approximately 55,000×. In particular, FIG. 12a is a photograph of an HSG layer formed as discussed with reference to FIGS. 5 through 11 wherein the second patterned electrode layer 52 is formed in-situ by flowing a dopant source such as PH$_3$ at 0.8% in a nitrogen (N$_2$) carrier at 50 sccm. In FIG. 12b, the HSG layer is formed by flowing 36 standard cubic cm (sccm) of PH$_3$ at 0.8% in a nitrogen (N$_2$) carrier to form the second electrode layer 52.

When comparing FIGS. 12a and 12b, the circumference of the hemispherical silicon grains is larger when the dopant concentration of the second electrode layer 52 is relatively low. In other words, the lower the dopant concentration of the material used to form the hemispherical silicon grains, the larger the grains will be thus increasing the surface area of the electrode thereby formed.

The lower electrodes of FIGS. 8 and 11 can thus be used to form capacitors by forming a dielectric layer thereon and then forming a conductive layer on the dielectric layer. A capacitor formed using a silicon lower electrode formed while flowing 50 sccm of $PH_3$ without an HSG layer can have a capacitance of 17 femto Farad (fF). By forming an HSG layer, however, a capacitance of 23 fF can be obtained. Accordingly, the capacitance can be increased by 35% through the formation of the HSG layer of FIG. 12a.

The capacitor formed using a lower silicon electrode formed while flowing 36 sccm of $PH_3$ without hemispherical silicon grains can have a capacitance of 16 fF. The capacitance can be increased, however, to 28 fF using the HSG layer of FIG. 12b. Accordingly, the capacitance can be increased by 75% using the HSG layer of FIG. 12b. A comparison of the capacitances achieved using the HSG layers of FIGS. 12a and 12b also shows that the capacitance can be increased when the HSG layer is formed from a silicon layer with a lower dopant concentration. The C' values for the capacitors formed using the HSG layers of FIGS. 12a and 12b were 0.9 and 0.6, respectively. The C' value, however, can be increased using a thermal step or an ion implant step after the HSG layer is formed thus increasing the dopant concentration of the HSG layer.

As discussed above, a silicon layer having a relatively low dopant concentration, for example, below $10^{19}$ atoms per $cm^3$, can be formed on a first electrode layer having a relatively high dopant concentration, for example, in the range of $10^{19}$ to $10^{22}$ atoms per $cm^3$, using an in-situ deposition technique. Grain seedlings can then be formed on the silicon layer, and the structure can be annealed in-situ to form an HSG layer, thereby increasing a surface area for the lower electrode. A subsequent thermal or implant step can be performed to increase the dopant concentration of the HSG layer.

Using the methods discussed above, the C' value and the capacitance for a capacitor including this lower electrode can be increased. Accordingly, the reproducibility and stability in operation for the capacitor can be increased. Because a large C' value means that there is less difference between the maximum and minimum capacitances, the loss of data stored in a capacitor formed according to the present invention can be reduced. In particular, the occurrence of soft errors during the operation of the capacitor in a memory device can be reduced thus increasing the reliability of the capacitor in a memory cell application.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming an integrated circuit capacitor, said method comprising the steps of:

forming a first electrode layer on a substrate wherein said first electrode layer has a first dopant concentration;

forming a second electrode layer on said first electrode layer opposite said substrate wherein said second electrode layer has a second dopant concentration different from said first dopant concentration;

converting a portion of said second electrode layer having said second dopant concentration to a hemispherical grain layer;

forming a second hemispherical grain layer on sidewalls of said first electrode layer having said first dopant concentration wherein grains of said second hemispherical grain layer are smaller than those of said first hemispherical grain layer.

2. A method according to claim 1 further comprising the steps of:

forming a dielectric layer on said hemispherical grain layer; and forming a conductive layer on said dielectric layer opposite said hemispherical grain layer.

3. A method according to claim 1 wherein said first dopant concentration is greater than said second dopant concentration.

4. A method according to claim 3 wherein said step of forming said first electrode layer is preceded by the step of:

forming an insulating layer on said substrate having a contact hole therein exposing said substrate wherein said first electrode layer fills said contact hole making electrical contact with said substrate.

5. A method according to claim 3 wherein said converting step is followed by the step of increasing a dopant concentration of said hemispherical grain layer.

6. A method according to claim 5 wherein said increasing step comprises heating said hemispherical grain layer to a temperature in the range of 750 to 950° C. in a nitrogen ($N_2$) atmosphere.

7. A method according to claim 5 wherein said increasing step comprises implanting dopant ions into said hemispherical grain layer.

8. A method according to claim 1 wherein said secondidopant concentration is less than $10^{19}$ atoms per $cm^3$.

9. A method according to claim 1 wherein said second electrode layer has a thickness in the range of 10 to 1,000 Angstroms.

10. A method according to claim 1 wherein said converting step comprises:

forming grain seedlings on said second electrode layer; and annealing said grain seedlings on said second electrode layer.

11. A method according to claim 10 wherein said steps of forming and annealing said grain seedlings are performed in situ.

12. A method according to claim 10 wherein said step of forming said grain seedlings comprises exposing said second electrode layer to a predetermined gas selected from the group consisting of silane ($SiH_4$) and disilane ($Si_2H_6$) at a predetermined temperature for a predetermined period of time.

13. A method according to claim 12 wherein said predetermined gas flows at a rate of 18 sccm, wherein said predetermined temperature is approximately 600° C., and wherein said predetermined period of time is approximately 185 seconds.

14. A method according to claim 10 wherein said annealing step comprises heating said grain seedlings to approximately 600° C. for approximately 420 seconds.

15. A method according to claim 1 wherein said first and second electrode layers comprise first and second silicon layers.

16. A method according to claim 15 wherein said steps of forming said first and second electrode layers comprises doping said first and second electrode layer in situ.

17. A method according to claim 16 wherein said steps of forming said first and second electrode layers each comprise using a source gas selected from the group consisting of silane ($SiH_4$) and disilane ($Si_2H_6$).

18. A method according to claim 16 wherein said first and second electrode layers are doped with a dopant selected from the group consisting of phosphorous (P), arsenic (As), and boron (B).

19. A method for forming an integrated circuit capacitor, said method comprising the steps of:

forming a first electrode layer on a substrate wherein said first electrode layer has a first dopant concentration;

forming a second electrode layer on said first electrode layer opposite said substrate wherein said second electrode layer has a second dopant concentration different from said first dopant concentration;

converting a portion of said second electrode layer to a hemispherical grain layer; and forming a spacer along sidewalls of said first electrode layer wherein said spacer has a third dopant concentration different from said first dopant concentration, and wherein said converting step comprises converting a portion of said spacer to said hemispherical grain layer, wherein said first dopant concentration is greater than said second and third dopant concentrations.

20. A method according to claim 19 wherein said second and third dopant concentrations are less than approximately $10^{19}$ atoms per $cm^3$.

21. A method according to claim 19 wherein said second electrode layer and said spacer each have a thickness in the range of 10 to 1000 Angstroms.

22. A method according to claim 19 wherein said converting step is followed by the step of increasing a dopant concentration of said hemispherical grain layer.

23. A method according to claim 22 wherein said increasing step comprises implanting dopant ions into said hemispherical grain layer.

24. A method according to claim 23 wherein said implanting step comprises implanting said dopant ions at an angle with respect to a surface of said substrate of less than 90°.

25. A method according to claim 19 wherein said first electrode layer, said second electrode layer, and said spacer comprise doped silicon.

26. A method for forming an integrated circuit capacitor, said method comprising the steps of:

forming an electrode layer on a substrate wherein said electrode layer has a surface opposite said substrate and sidewalls;

forming a first hemispherical grain layer on said surface of said electrode layer wherein said first hemispherical grain layer has a first grain size; and forming a second hemispherical grain layer on said sidewalls of said electrode layer wherein said second hemispherical grain layer has a second grain size different from said first grain size wherein said first and second hemispherical grain silicon layers are formed simultaneously.

27. A method according to claim 26 wherein said first grain size is greater than said second grain size.

28. A method according to claim 26:

wherein said step of forming said electrode layer comprises;

forming a first electrode layer on said substrate wherein said first electrode layer has a first dopant concentration, and forming a second electrode layer on said first electrode layer opposite said substrate wherein said second electrode layer has a second dopant concentration different from said first dopant concentration; and wherein said step of forming said first hemispherical grain layer comprises converting a portion of said second electrode layer having said second dopant concentration to said first hemispherical grain layer; and wherein said step of forming said second hemispherical grain layer comprises converting sidewalls of said first electrode layer having said first dopant concentration to said second hemispherical grain layer.

29. A method according to claim 28 wherein said first dopant concentration is greater than said second dopant concentration.

30. A method according to claim 29 wherein said converting step is followed by the step of increasing a dopant concentration of said hemispherical grain layer.

31. A method according to claim 26 further comprising the steps of:

forming a dielectric layer on said first and second hemispherical grain layers; and forming a conductive layer on said dielectric layer opposite said hemispherical grain layers.

32. A method according to claim 26 wherein said substrate comprises a semiconductor substrate and wherein said step of forming said electrode layer is preceded by the step of:

forming an insulating layer on said substrate having a contact hole therein exposing said semiconductor substrate wherein said electrode layer fills said contact hole making electrical contact with said semiconductor substrate.

33. A method according to claim 1 wherein said first and second hemispherical grained layers are formed simultaneously.

* * * * *

UNITED STATES PATENT AND TRADEMARK OFFICE
CERTIFICATE OF CORRECTION

PATENT NO. : 5,963,805
DATED : October 5, 1999
INVENTOR(S) : Kang et al.

It is certified that error appears in the above-identified patent and that said Letters Patent is hereby corrected as shown below:

On the Cover Sheet:

In the first line of the title, delete "METHOD" and insert - - METHODS - -.

Under "Other Publications," in the fourth line of the H. Watanabe reference, after "IEDM, insert – pp. – and after "10.1.1-10.1.14", delete "(No Month)" and insert - - (April 1992) - -.

Column 10, line 34, delete "secondi-" and insert - - second - -.

Signed and Sealed this

Thirtieth Day of January, 2001

Attest:

Q. TODD DICKINSON

*Attesting Officer*  *Director of Patents and Trademarks*